(12) United States Patent
Khlat

(10) Patent No.: US 12,206,365 B2
(45) Date of Patent: Jan. 21, 2025

(54) VOLTAGE RIPPLE SUPPRESSION IN A TRANSMISSION CIRCUIT

(71) Applicant: Nadim Khlat, Cugnaux (FR)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 388 days.

(21) Appl. No.: 17/714,244

(22) Filed: Apr. 6, 2022

(65) Prior Publication Data

US 2022/0407465 A1 Dec. 22, 2022

Related U.S. Application Data

(60) Provisional application No. 63/212,428, filed on Jun. 18, 2021.

(51) Int. Cl.
*H03F 1/02* (2006.01)
*H03F 3/24* (2006.01)

(52) U.S. Cl.
CPC ........... *H03F 1/0233* (2013.01); *H03F 3/245* (2013.01); *H03F 2200/105* (2013.01); *H03F 2200/451* (2013.01)

(58) Field of Classification Search
CPC .. H03F 1/0233; H03F 3/245; H03F 2200/105; H03F 2200/451
(Continued)

(56) References Cited

U.S. PATENT DOCUMENTS

| 4,797,898 A | 1/1989 | Martinez |
| 5,793,821 A | 8/1998 | Norrell et al. |

(Continued)

FOREIGN PATENT DOCUMENTS

| CN | 105812073 A | 7/2016 |
| CN | 110798155 A | 2/2020 |

(Continued)

OTHER PUBLICATIONS

International Search Report and Written Opinion for International Patent Application No. PCT/US2022/043600, mailed Jan. 11, 2023, 15 pages.

(Continued)

*Primary Examiner* — Patricia T Nguyen
(74) *Attorney, Agent, or Firm* — Withrow & Terranova, P.L.L.C.

(57) ABSTRACT

Voltage ripple suppression in a transmission circuit is disclosed. The transmission circuit includes a power amplifier circuit coupled to an envelope tracking integrated circuit (ETIC) via a conductive path. Notably, the ETIC and the conductive path can present a large source impedance to the power amplifier circuit, which can cause a ripple in the modulated voltage received by the power amplifier circuit. In a conventional approach, the large source impedance may be isolated by a large decoupling capacitor at the expense of increased voltage switching time and battery current drain. In contrast, the ETIC disclosed herein can determine and apply a correction term to the modulated voltage generated by the ETIC to thereby suppress the ripple without requiring the large decoupling capacitor. By eliminating the large decoupling capacitor, the transmission circuit can thus achieve fast voltage switching with lower battery current drain.

20 Claims, 8 Drawing Sheets

(58) Field of Classification Search
USPC .......................................................... 330/297
See application file for complete search history.

(56) References Cited

U.S. PATENT DOCUMENTS

| | | |
|---|---|---|
| 6,760,451 B1 | 7/2004 | Craven et al. |
| 7,076,225 B2 | 7/2006 | Li et al. |
| 7,430,248 B2 | 9/2008 | McCallister |
| 7,663,436 B2 | 2/2010 | Takano et al. |
| 7,683,713 B2 | 3/2010 | Hongo |
| 7,859,338 B2 | 12/2010 | Bajdechi et al. |
| 7,889,820 B2 | 2/2011 | Murthy et al. |
| 8,605,819 B2 | 12/2013 | Lozhkin |
| 8,749,309 B2 | 6/2014 | Ho et al. |
| 8,831,544 B2 | 9/2014 | Walker et al. |
| 9,036,734 B1 | 5/2015 | Mauer et al. |
| 9,065,504 B2 | 6/2015 | Kwon et al. |
| 9,112,413 B2 | 8/2015 | Barth et al. |
| 9,356,760 B2 | 5/2016 | Larsson et al. |
| 9,438,196 B2 | 9/2016 | Smith et al. |
| 9,560,595 B2 | 1/2017 | Dakshinamurthy et al. |
| 9,692,366 B2 | 6/2017 | Pilgram |
| 9,705,477 B2 | 7/2017 | Velazquez |
| 10,177,719 B2 | 1/2019 | Gazneli et al. |
| 10,305,435 B1 | 5/2019 | Murugesu et al. |
| 10,326,408 B2 | 6/2019 | Khlat et al. |
| 10,361,744 B1 | 7/2019 | Khlat |
| 10,476,437 B2* | 11/2019 | Nag ................ H03F 1/0216 |
| 10,778,345 B2 | 9/2020 | El-Hassan et al. |
| 11,005,368 B2 | 5/2021 | Bansal et al. |
| 11,088,660 B2 | 8/2021 | Lin et al. |
| 11,387,789 B2 | 7/2022 | Khlat et al. |
| 11,424,719 B2 | 8/2022 | Khlat |
| 11,569,783 B2 | 1/2023 | Nomiyama et al. |
| 11,637,531 B1* | 4/2023 | Perreault ............ H03F 1/0227 |
| | | 330/297 |
| 2001/0054974 A1 | 12/2001 | Wright |
| 2002/0190811 A1 | 12/2002 | Sperber |
| 2003/0042979 A1 | 3/2003 | Gurvich et al. |
| 2004/0239446 A1 | 12/2004 | Gurvich et al. |
| 2005/0100105 A1 | 5/2005 | Jensen |
| 2005/0254659 A1 | 11/2005 | Heinsen |
| 2006/0068710 A1 | 3/2006 | Jensen |
| 2006/0209981 A1 | 9/2006 | Kluesing et al. |
| 2006/0217083 A1 | 9/2006 | Braithwaite |
| 2007/0032208 A1 | 2/2007 | Choi et al. |
| 2008/0246550 A1 | 10/2008 | Biedka et al. |
| 2009/0004981 A1* | 1/2009 | Eliezer ................ H03F 1/3247 |
| | | 455/127.1 |
| 2009/0074106 A1 | 3/2009 | See et al. |
| 2009/0125264 A1 | 5/2009 | Betts et al. |
| 2009/0141830 A1 | 6/2009 | Ye |
| 2009/0302945 A1 | 12/2009 | Catoiu et al. |
| 2010/0298030 A1 | 11/2010 | Howard |
| 2011/0182347 A1 | 7/2011 | Cheung |
| 2011/0227767 A1 | 9/2011 | O'Brien |
| 2012/0068748 A1 | 3/2012 | Stojanovic et al. |
| 2012/0139635 A1 | 6/2012 | Ho et al. |
| 2012/0189081 A1 | 7/2012 | Omoto et al. |
| 2012/0256688 A1 | 10/2012 | Onishi |
| 2013/0141062 A1 | 6/2013 | Khlat |
| 2013/0222057 A1* | 8/2013 | Henshaw ............. H03F 1/0222 |
| | | 330/127 |
| 2013/0243129 A1 | 9/2013 | Okuni et al. |
| 2014/0028368 A1 | 1/2014 | Khlat |
| 2014/0062590 A1* | 3/2014 | Khlat ................... H03F 1/0227 |
| | | 330/127 |
| 2014/0065989 A1 | 3/2014 | McLaurin |
| 2014/0072307 A1 | 3/2014 | Zamani et al. |
| 2014/0084996 A1 | 3/2014 | Schwent et al. |
| 2014/0105264 A1 | 4/2014 | McLaurin et al. |
| 2014/0184337 A1 | 7/2014 | Nobbe et al. |
| 2014/0213196 A1 | 7/2014 | Langer et al. |
| 2014/0232470 A1 | 8/2014 | Wilson |
| 2014/0266432 A1 | 9/2014 | Scott et al. |
| 2014/0315504 A1 | 10/2014 | Sakai et al. |
| 2014/0361837 A1* | 12/2014 | Strange ................. H03F 3/195 |
| | | 330/297 |
| 2015/0028946 A1 | 1/2015 | Al-Qaq et al. |
| 2016/0173030 A1 | 6/2016 | Langer et al. |
| 2016/0182100 A1 | 6/2016 | Menkhoff et al. |
| 2016/0301432 A1 | 10/2016 | Shizawa et al. |
| 2017/0005676 A1 | 1/2017 | Yan et al. |
| 2017/0104502 A1 | 4/2017 | Pratt |
| 2017/0149457 A1 | 5/2017 | Mayer et al. |
| 2017/0170838 A1 | 6/2017 | Pagnanelli |
| 2017/0338842 A1 | 11/2017 | Pratt |
| 2018/0034418 A1 | 2/2018 | Blednov |
| 2018/0248570 A1 | 8/2018 | Camuffo |
| 2019/0041890 A1 | 2/2019 | Chen et al. |
| 2019/0058530 A1 | 2/2019 | Rainish et al. |
| 2019/0068234 A1 | 2/2019 | Khlat et al. |
| 2019/0238152 A1 | 8/2019 | Pagnanelli |
| 2019/0245496 A1 | 8/2019 | Khlat et al. |
| 2019/0296929 A1 | 9/2019 | Milicevic et al. |
| 2019/0319583 A1 | 10/2019 | El-Hassan et al. |
| 2019/0356285 A1 | 11/2019 | Khlat et al. |
| 2020/0106392 A1 | 4/2020 | Khlat et al. |
| 2020/0136563 A1 | 4/2020 | Khlat |
| 2020/0162030 A1 | 5/2020 | Drogi et al. |
| 2020/0259685 A1 | 8/2020 | Khlat |
| 2020/0295713 A1 | 9/2020 | Khlat |
| 2020/0336111 A1 | 10/2020 | Khlat |
| 2021/0099136 A1 | 4/2021 | Drogi et al. |
| 2021/0194517 A1 | 6/2021 | Mirea et al. |
| 2021/0281228 A1 | 9/2021 | Khlat |
| 2021/0399690 A1 | 12/2021 | Panseri et al. |
| 2022/0216834 A1 | 7/2022 | Myoung et al. |
| 2022/0360229 A1 | 11/2022 | Khlat |
| 2022/0407462 A1 | 12/2022 | Khlat |
| 2022/0407464 A1 | 12/2022 | Khlat et al. |
| 2022/0407465 A1 | 12/2022 | Khlat et al. |
| 2022/0407478 A1 | 12/2022 | Khlat et al. |
| 2023/0079153 A1 | 3/2023 | Khlat |
| 2023/0080621 A1 | 3/2023 | Khlat |
| 2023/0080652 A1 | 3/2023 | Khlat et al. |
| 2023/0081095 A1 | 3/2023 | Khlat |
| 2023/0082145 A1 | 3/2023 | Lin et al. |
| 2023/0238927 A1 | 7/2023 | Kay et al. |
| 2023/0387859 A1 | 11/2023 | Drogi et al. |

FOREIGN PATENT DOCUMENTS

| | | |
|---|---|---|
| EP | 2705604 A2 | 3/2014 |
| EP | 2582041 B1 | 4/2018 |
| EP | 2232713 B1 | 10/2018 |
| EP | 3416340 A1 | 12/2018 |
| WO | 2007092794 A2 | 8/2007 |
| WO | 2010135711 A1 | 11/2010 |
| WO | 2014026178 A1 | 2/2014 |
| WO | 2023150539 A1 | 8/2023 |
| WO | 2023150545 A1 | 8/2023 |

OTHER PUBLICATIONS

Non-Final Office Action for U.S. Appl. No. 17/942,472, mailed Feb. 16, 2023, 13 pages.
Extended European Search Report for European Patent Application No. 22195382.1, mailed Feb. 1, 2023, 26 pages.
Extended European Search Report for European Patent Application No. 22195683.2, mailed Feb. 10, 2023, 12 pages.
Williams, P., "Crossover Filter Shape Comparisons," White Paper, Linea Research, Jul. 2013, 13 pages.
Corrected Notice of Allowability for U.S. Appl. No. 17/942,472, mailed Nov. 17, 2023, 6 pages.
Non-Final Office Action for U.S. Appl. No. 17/939,350, mailed Jan. 17, 2024, 11 pages.
U.S. Appl. No. 17/700,685, filed Mar. 22, 2022.
U.S. Appl. No. 17/689,232, filed Mar. 8, 2022.
U.S. Appl. No. 17/700,826, filed Mar. 22, 2022.
Paek, J.-S. et al., "Design of Boosted Supply Modulator With Reverse Current Protection for Wide Battery Range in Envelope

(56) References Cited

OTHER PUBLICATIONS

Tracking Operation," IEEE Transactions on Microwave Theory and Techniques, vol. 67, No. 1, Jan. 2019, pp. 183-194.
Non-Final Office Action for U.S. Appl. No. 17/700,685, mailed Dec. 22, 2023, 24 pages.
Non-Final Office Action for U.S. Appl. No. 17/689,232, mailed Dec. 11, 2023, 27 pages.
Notice of Allowance and Examiner-Initiated Interview Summary for U.S. Appl. No. 17/737,300, mailed Dec. 19, 2023, 12 pages.
Notice of Allowance for U.S. Appl. No. 17/700,700, mailed Oct. 23, 2023, 9 pages.
Supplemental Notice of Allowability for U.S. Appl. No. 17/700,700, mailed Nov. 8, 2023, 5 pages.
Extended European Search Report for European Patent Application No. 231740101.1, mailed Oct. 10, 2023, 10 pages.
Corrected Notice of Allowability for U.S. Appl. No. 17/737,300, mailed Dec. 27, 2023, 8 pages.
Advisory Action for U.S. Appl. No. 17/942,472, mailed Sep. 15, 2023, 3 pages.
Notice of Allowance for U.S. Appl. No. 17/942,472, mailed Oct. 18, 2023, 10 pages.
International Search Report and Written Opinion for International Patent Application No. PCT/US2023/019267, mailed Aug. 3, 2023, 14 pages.
Non-Final Office Action for U.S. Appl. No. 17/700,700, mailed Apr. 13, 2023, 11 pages.
Bai, W.-D. et al., "Principle of Vector Synthesis Predistortion Linearizers Controlling AM/AM and AM/PM Independently," 2016 IEEE International Conference on Ubiquitous Wireless Broadband (ICUWB), Oct. 16-19, 2016, Nanjing, China, IEEE, 3 pages.
Extended European Search Report for European Patent Application No. 22195695.6, mailed Feb. 14, 2023, 12 pages.
Extended European Search Report for European Patent Application No. 22196188.1, mailed Feb. 2, 2023, 25 pages.
Notice of Allowance for U.S. Appl. No. 17/700,685, mailed Apr. 5, 2024, 7 pages.
Final Office Action for U.S. Appl. No. 17/689,232, mailed Mar. 26, 2024, 28 pages.
Supplemental Notice of Allowability for U.S. Appl. No. 17/700,700, mailed Feb. 28, 2024, 5 pages.
Cho, M., "Analog Predistortion for Improvement of RF Power Amplifier Efficiency and Linearity," A Dissertation presented to the Academic Faculty in partial fulfillment of the requirements for the degree Doctor of Philosophy in the School of Electrical and Computer Engineering, Georgia Institute of Technology, Aug. 2016, available from the Internet: [URL: https://repository.gatech.edu/server/api/core/bitstreams/b8fe5cbb-e5db-4efe-b9a2-eaad5f671f14/content], 113 pages.
Kwak, T.-W. et al., "A 2W CMOS Hybrid Switching Amplitude Modulator for EDGE Polar Transmitters," IEEE Journal of Solid-State Circuits, vol. 42, No. 12, Dec. 2007, IEEE, pp. 2666-2676.
Paek, J.-S. et al., "A -137 dBm/Hz Noise, 82% Efficiency AC-Coupled Hybrid Supply Modulator With Integrated Buck-Boost Converter," IEEE Journal of Solid-State Circuits, vol. 51, No. 11, Nov. 2016, IEEE pp. 2757-2768.
Non-Final Office Action for U.S. Appl. No. 17/737,300, mailed Aug. 28, 2023, 14 pages.
Extended European Search Report for European Patent Application No. 23153108.8, mailed Jun. 20, 2023, 18 pages.
International Search Report and Written Opinion for International Patent Application No. PCT/US2023/060303, mailed Apr. 11, 2023, 12 pages.
Final Office Action for U.S. Appl. No. 17/942,472, mailed Jul. 19, 2023, 16 pages.
Advisory Action U.S. Appl. No. 17/689,232, mailed May 23, 2024, 3 pages.
Non-Final Office Action for U.S. Appl. No. 17/689,232, mailed Jul. 17, 2024, 22 pages.
Final Office Action for U.S. Appl. No. 17/939,350, mailed May 21, 2024, 11 pages.
Non-Final Office Action for U.S. Appl. No. 17/700,826, mailed May 15, 2024, 28 pages.
International Search Report and Written Opinion for International Patent Application No. PCT/US2023/061734, mailed May 30, 2023, 15 pages.
International Search Report and Written Opinion for International Patent Application No. PCT/US2023/061741, mailed Jun. 1, 2023, 14 pages.
Invitation to Pay Additional Fees and Partial International Search for International Patent Application No. PCT/US2023/061804, mailed May 26, 2023, 10 pages.
International Search Report and Written Opinion for International Patent Application No. PCT/US2023/061804, mailed Jul. 17, 2023, 20 pages.
Notice of Allowance for U.S. Appl. No. 17/689,232, mailed Oct. 21, 2024, 10 pages.
Non-Final Office Action for U.S. Appl. No. 17/939,350, mailed Sep. 6, 2024, 8 pages.
Non-Final Office Action for U.S. Appl. No. 17/890,538, mailed Oct. 21, 2024, 13 pages.
Notice of Allowance and Examiner-Initiated Interview Summary for U.S. Appl. No. 17/700,826, mailed Sep. 11, 2024, 10 pages.

\* cited by examiner

VOLTAGE RIPPLE SUPPRESSION IN A TRANSMISSION CIRCUIT

RELATED APPLICATIONS

This application claims the benefit of U.S. provisional patent application Ser. No. 63/212,428, filed on Jun. 18, 2021, the disclosure of which is incorporated herein by reference in its entirety.

FIELD OF THE DISCLOSURE

The technology of the disclosure relates generally to reducing voltage ripple in a transmission circuit.

BACKGROUND

Fifth generation (5G) new radio (NR) (5G-NR) has been widely regarded as the next generation of wireless communication technology beyond the current third generation (3G) and fourth generation (4G) technologies. In this regard, a wireless communication device capable of supporting the 5G-NR wireless communication technology is expected to achieve higher data rates, improved coverage range, enhanced signaling efficiency, and reduced latency.

Downlink and uplink transmissions in a 5G-NR system are widely based on orthogonal frequency division multiplexing (OFDM) technology. In an OFDM based system, physical radio resources are divided into a number of subcarriers in a frequency domain and a number of OFDM symbols in a time domain. The subcarriers are orthogonally separated from each other by a subcarrier spacing (SCS). The OFDM symbols are separated from each other by a cyclic prefix (CP), which acts as a guard band to help overcome inter-symbol interference (ISI) between the OFDM symbols.

A radio frequency (RF) signal communicated in the OFDM based system is often modulated into multiple subcarriers in the frequency domain and multiple OFDM symbols in the time domain. The multiple subcarriers occupied by the RF signal collectively define a modulation bandwidth of the RF signal. The multiple OFDM symbols, on the other hand, define multiple time intervals during which the RF signal is communicated. In the 5G-NR system, the RF signal is typically modulated with a high modulation bandwidth in excess of 200 MHz (e.g., 1 GHz).

The duration of an OFDM symbol depends on the SCS and the modulation bandwidth. The table below (Table 1) provides some OFDM symbol durations, as defined by 3G partnership project (3GPP) standards for various SCSs and modulation bandwidths. Notably, the higher the modulation bandwidth is, the shorter the OFDM symbol duration will be. For example, when the SCS is 120 KHz and the modulation bandwidth is 400 MHz, the OFDM symbol duration is 8.93 µs.

TABLE 1

| SCS (KHz) | CP (µs) | OFDM Symbol Duration (µs) | Modulation Bandwidth (MHz) |
|---|---|---|---|
| 15 | 4.69 | 71.43 | 50 |
| 30 | 2.34 | 35.71 | 100 |
| 60 | 1.17 | 17.86 | 200 |
| 120 | 0.59 | 8.93 | 400 |

Notably, the wireless communication device relies on a battery cell (e.g., Li-Ion battery) to power its operations and services. Despite recent advancement in battery technologies, the wireless communication device can run into a low battery situation from time to time. In this regard, it is desirable to prolong battery life concurrent to enabling fast voltage changes between the OFDM symbols.

SUMMARY

Embodiments of the disclosure relate to voltage ripple suppression in a transmission circuit. Specifically, the transmission circuit includes a power amplifier circuit configured to amplify a radio frequency (RF) signal based on a modulated voltage, and an envelope tracking (ET) integrated circuit (ETIC) configured to generate and provide the modulated voltage to the power amplifier circuit via a conductive path. Notably, the ETIC and the conductive path can present a large source impedance to the power amplifier circuit, which can cause a ripple in the modulated voltage received by the power amplifier circuit to potentially distort the RF signal. In a conventional approach, the large source impedance may be isolated by a large decoupling capacitor at the expense of increased voltage switching time and battery current drain. In contrast, the ETIC disclosed herein can determine and apply a correction term to the modulated voltage generated by the ETIC to thereby suppress the ripple without requiring the large decoupling capacitor. By eliminating the large decoupling capacitor, the transmission circuit can thus achieve fast voltage switching with lower battery current drain.

In one aspect, a transmission circuit is provided. The transmission circuit includes a power amplifier (PA) circuit. The PA circuit is configured to amplify an RF signal based on a modulated voltage received at a PA input. The transmission circuit also includes an ETIC. The ETIC includes an ETIC output coupled to the PA input via a conductive path. The ETIC also includes a voltage modulation circuit. The voltage modulation circuit is configured to generate the modulated voltage at the ETIC output based on a modulated target voltage and a feedback signal that indicates a selected one of the modulated voltage at the ETIC output and the modulated voltage at the PA input. The ETIC also includes a control circuit. The control circuit is configured to generate a correction term based on the modulated voltage at the ETIC output and the modulated voltage at the PA input. The control circuit is also configured to apply the correction term to a selected one of the modulated target voltage and the feedback signal to cause the voltage modulation circuit to modify the modulated voltage to thereby suppress a ripple in the modulated voltage at the PA input.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
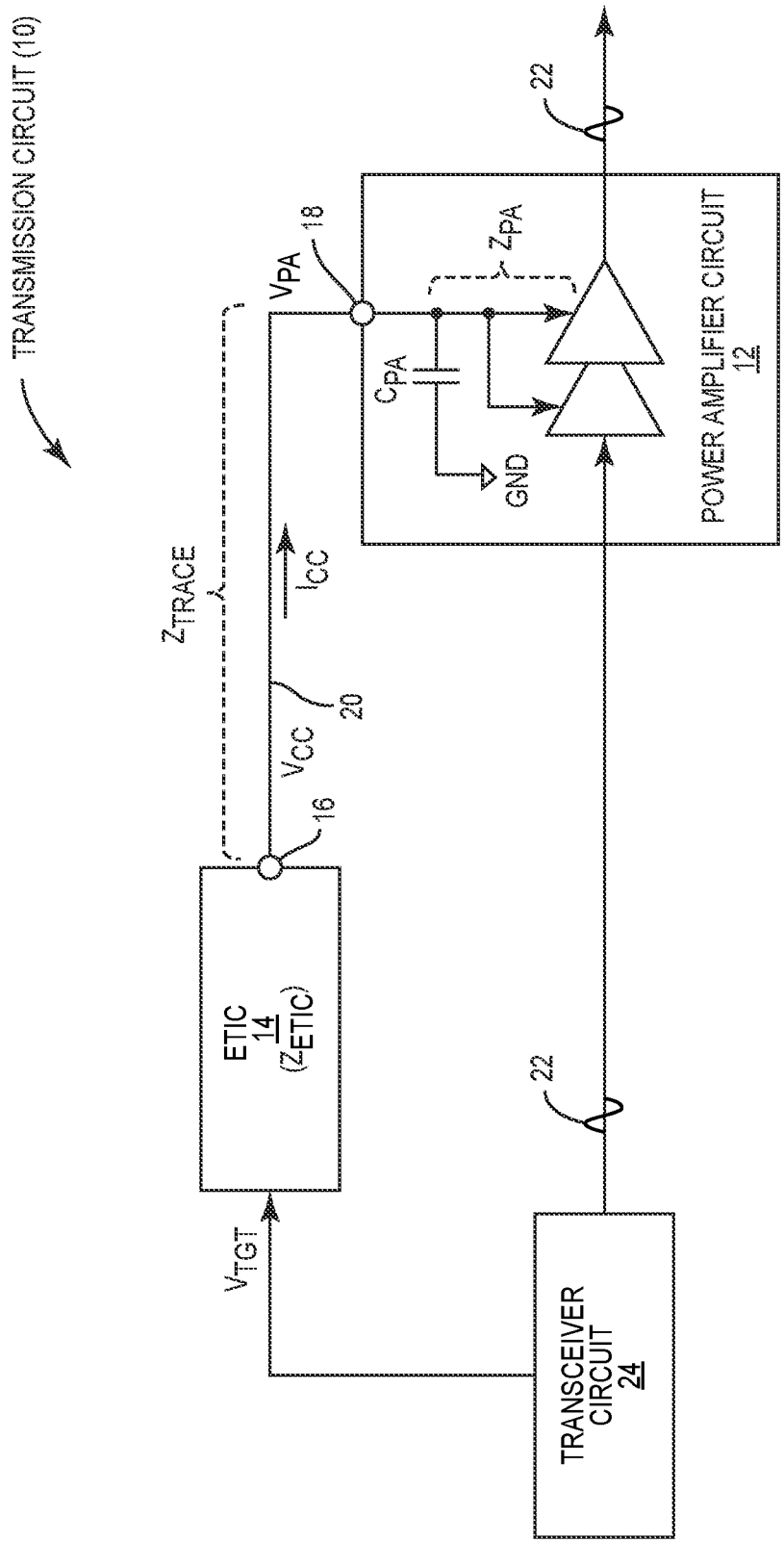
FIG. 1 is a schematic diagram of an exemplary transmission circuit that can be configured based on various embodiments of the present disclosure to support voltage ripple suppression.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to voltage ripple suppression in a transmission circuit. Specifically, the transmission circuit includes a power amplifier circuit configured to amplify a radio frequency (RF) signal based on a modulated voltage, and an envelope tracking (ET) integrated circuit (ETIC) configured to generate and provide the modulated voltage to the power amplifier circuit via a conductive path. Notably, the ETIC and the conductive path can present a large source impedance to the power amplifier circuit, which can cause a ripple in the modulated voltage received by the power amplifier circuit to potentially distort the RF signal. In a conventional approach, the large source impedance may be isolated by a large decoupling capacitor at the expense of increased voltage switching time and battery current drain. In contrast, the ETIC disclosed herein can determine and apply a correction term to the modulated voltage generated by the ETIC to thereby suppress the ripple without requiring the large decoupling capacitor. By eliminating the large decoupling capacitor, the transmission circuit can thus achieve fast voltage switching with lower battery current drain.

FIG. 1 is a schematic diagram of an exemplary transmission circuit 10 that can be configured based on various embodiments of the present disclosure to support voltage ripple suppression. The transmission circuit 10 includes a power amplifier circuit 12 and an ETIC 14. The ETIC 14 is configured to generate a modulated voltage $V_{CC}$ at an ETIC output 16 based on a modulated target voltage $V_{TGT}$. The power amplifier circuit 12 is configured to receive the modulated voltage $V_{CC}$ at a power amplifier input 18. The power amplifier input 18 is coupled to the ETIC output 16 via a conductive path 20, which can be a conductive trace, as an example. Accordingly, the power amplifier circuit 12 can be configured to amplify an RF signal 22 based on the modulated voltage $V_{CC}$. In a non-limiting example, the modulated target voltage $V_{TGT}$ and the RF signal 22 can be generated by a transceiver circuit 24.

For distinction, the modulated voltage $V_{CC}$ generated by the ETIC 14 at the ETIC output 16 is hereinafter referred to as "generated modulated voltage $V_{CC}$." In contrast, the modulated voltage $V_{CC}$ received by the power amplifier circuit 12 at the power amplifier input 18 is hereinafter referred to as "received modulated voltage $V_{PA}$."

In a non-limiting example, the ETIC 14 has an inherent ETIC impedance $Z_{ETIC}$, the conductive path 20 has an inherent trace impedance $Z_{TRACE}$ (e.g., an inductive impedance), and the power amplifier circuit 12 has an inherent power amplifier impedance $Z_{PA}$. In this regard, the ETIC 14 and the conductive path 20 can collectively present a large source impedance ($Z_{ETIC}+Z_{TRACE}$) to the power amplifier circuit 12. The power amplifier circuit 12, on the other hand, is configured to operate as a current source to draw a modulated current $I_{CC}$. As such, the large source impedance ($Z_{ETIC}+Z_{TRACE}$) in conjunction with the modulated current $I_{CC}$ can cause a ripple in the received modulated voltage $V_{PA}$ to potentially distort the RF signal 22.

Conventionally, it may be possible to isolate the large source impedance ($Z_{ETIC}+Z_{TRACE}$) from the power amplifier circuit 12, and thereby suppress the ripple in the received modulated voltage $V_{PA}$, by coupling a decoupling capacitor (not shown) with a large-enough capacitance to the power amplifier input 18. However, doing so can cause some obvious issues.

$$I_{CC}=C*dV_{CC}/dt \quad (Eq. 1)$$

As shown in equation (Eq. 1), the larger capacitance (C) the decoupling capacitor has, the larger amount of the modulated current $I_{CC}$ would be needed to change the modulated voltage $V_{CC}$ at a required change rate ($dV_{CC}/dt$). As a result, the transmission circuit 10 may cause a negative impact on battery life. On the other hand, if the modulated current $I_{CC}$ is kept at a low level to prolong battery life, the transmission circuit 10 may have difficulty meeting the required change rate ($dV_{CC}/dt$). Consequently, the transmission circuit 10 may not be able to change the modulated voltage $V_{CC}$ between orthogonal frequency division multiplexing (OFDM) symbols, especially when the RF signal 22 is modulated with a higher modulation bandwidth (e.g., >200 NHz). Hence, it is desirable to suppress the ripple in the received modulated voltage $V_{PA}$ without employing the large-capacitance decoupling capacitor to thereby improve battery life and enable fast switching of the modulated voltage $V_{CC}$.

Figure 2:
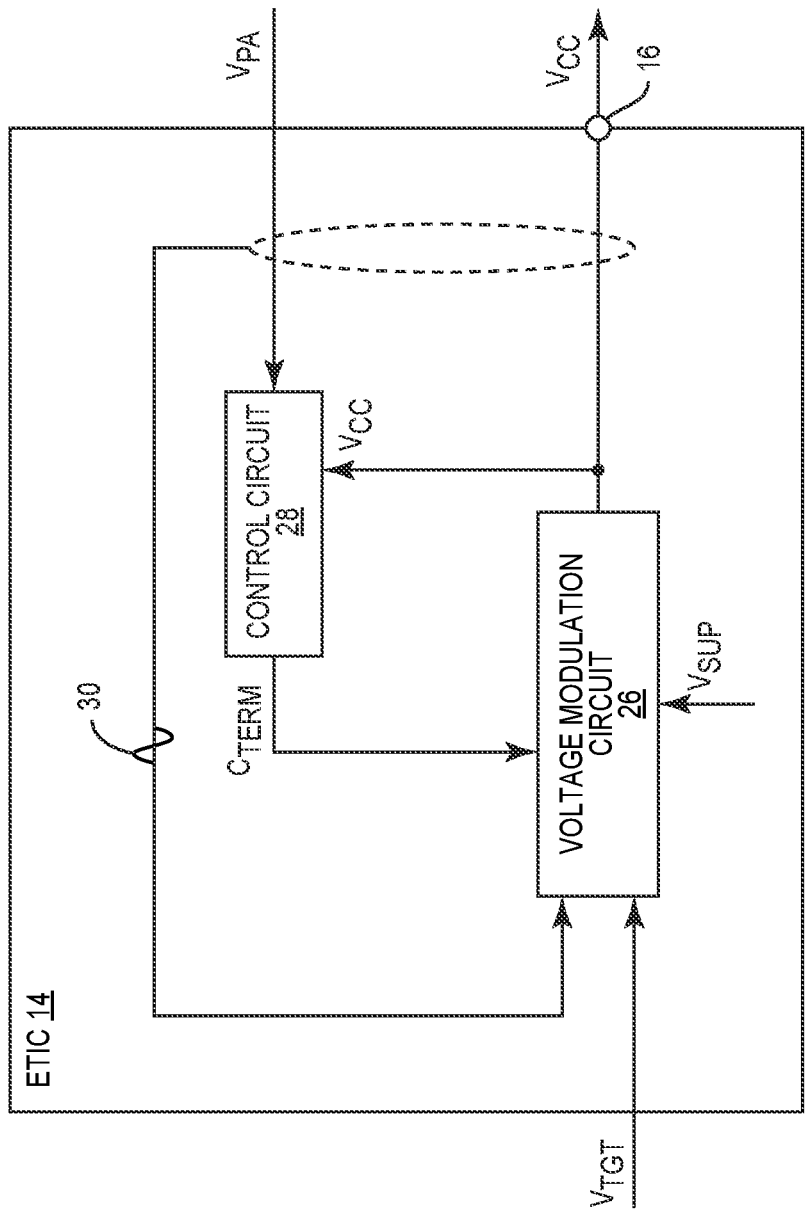
FIG. 2 is a schematic diagram providing an exemplary illustration of an envelope tracking integrated circuit (ETIC) in the transmission circuit of FIG. 1, which can be configured according to embodiments of the present disclosure to enable voltage ripple suppression in the transmission circuit.

In this regard, FIG. 2 is a schematic diagram providing an exemplary illustration of the ETIC 14 in FIG. 1, which can be configured according to embodiments of the present disclosure to suppress the ripple in the received modulated voltage $V_{PA}$ without requiring the large-capacitance decoupling capacitor. Common elements between FIGS. 1 and 2 are shown therein with common element numbers and will not be re-described herein.

In an embodiment, the ETIC 14 includes a voltage modulation circuit 26 and a control circuit 28. The voltage modulation circuit 26 is configured to generate the modulated voltage $V_{CC}$ (a.k.a. the generated modulated voltage $V_{CC}$) at the ETIC output 16 based on the modulated target voltage $V_{TGT}$ and a feedback signal 30. As described in various embodiments in FIGS. 3 to 7, the feedback signal 30 can indicate a selected one of the generated modulated voltage $V_{CC}$ and the received modulated voltage $V_{PA}$. The control circuit 28, which can be a field-programmable gate array (FPGA) or an application-specific integrated circuit (ASIC), as an example, is configured to generate a correction term $C_{TERM}$ based on a voltage differential $\Delta V$ between the generated modulated voltage $V_{CC}$ and the received modulated voltage $V_{PA}$ ($\Delta V=V_{CC}-V_{PA}$). As further described in various embodiments in FIGS. 3 to 7, the control circuit 28 can apply the correction term $C_{TERM}$ to a selected one of the modulated target voltage $V_{TGT}$ and the feedback signal 30 to cause the voltage modulation circuit 26 to modify the generated modulated voltage $V_{CC}$ to thereby suppress the ripple in the received modulated voltage $V_{PA}$. By suppressing the ripple in the received modulated voltage $V_{PA}$ based on the correction term $C_{TERM}$, as opposed to employing the large-capacitance decoupling capacitor, the transmission circuit 10 can thus improve battery life and enable fast switching of the modulated voltage $V_{CC}$.

The ETIC 14 can be configured according to various embodiments of the present disclosure. Specific embodiments of the ETIC 14 are described now with reference to FIGS. 3 to 7. Common elements between FIGS. 1 to 7 are shown therein with common element numbers and will not be re-described herein.

Figure 3:
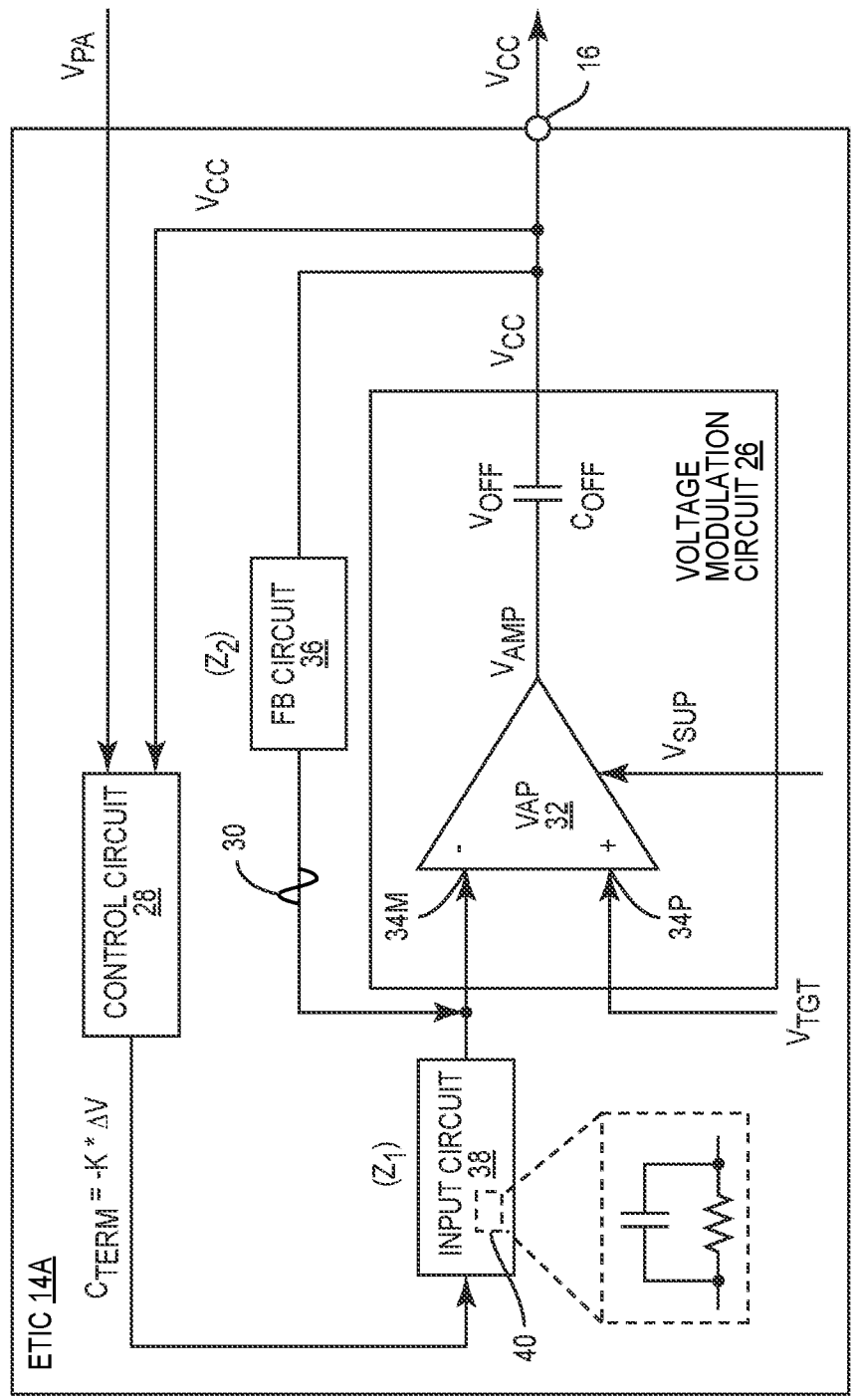
FIGS. 3-7 are schematic diagrams providing exemplary illustrations of the ETIC in FIG. 2 configured according to various embodiments of the present disclosure.

FIG. 3 is a schematic diagram of an exemplary ETIC 14A configured according to one embodiment of the present disclosure. The voltage modulation circuit 26 includes a voltage amplifier 32 (denoted as "$V_{PA}$"). In a non-limiting example, the voltage amplifier 32 can be an operational amplifier (op-amp) having a positive input 34P (denoted as "+") and a negative input 34M (denoted as "−"). Herein, the positive input 34P is configured to receive the modulated voltage $V_{TGT}$ and the negative input 34M is configured to receive the feedback signal 30 and the correction term $C_{TERM}$. Accordingly, the voltage amplifier 32 is configured to generate an initial modulated voltage $V_{AMP}$ based on the modulated target voltage $V_{TGT}$, the feedback signal 30, the correction term $C_{TERM}$, and a supply voltage $V_{SUP}$.

The voltage modulation circuit 26 also includes an offset capacitor $C_{OFF}$, which is coupled between the voltage amplifier 32 and the ETIC output 16. The offset capacitor $C_{OFF}$ is configured to raise the initial modulated voltage $V_{AMP}$ by an offset voltage $V_{OFF}$ to thereby generate the modulated voltage $V_{CC}$ ($V_{CC}=V_{AMP}+V_{OFF}$) at the ETIC output 16. Notably, by providing the offset capacitor $C_{OFF}$, the initial modulated voltage $V_{AMP}$ will be lower than the modulated voltage $V_{CC}$. As a result, an output stage of the voltage amplifier 32 (not shown) can be implemented using a smaller transistor(s) to thereby reduce footprint and improve operating efficiency.

The ETIC 14A includes a feedback circuit 36 coupled between the ETIC output 16 and the negative input 34M. Accordingly, the feedback circuit 36 is configured to generate the feedback signal 30 to indicate the generated modulated voltage $V_{CC}$ and provide the feedback signal 30 to the negative input 34M.

In this embodiment, the control circuit 28 is coupled to the negative input 34M via an input circuit 38. Accordingly, the control circuit 28 is configured to generate the correction term $C_{TERM}$ based on the voltage differential $\Delta V$ and provides the correction term $C_{TERM}$ to the input circuit 38.

The input circuit 38 receives the correction term $C_{TERM}$ from the control circuit 28. Accordingly, the input circuit 38 can apply the correction term $C_{TERM}$ to the feedback signal 30, which indicates the generated modulated voltage $V_{CC}$, to thereby cause the voltage modulation circuit 26 to modify the generated modulated voltage $V_{CC}$ to suppress the ripple in the received modulated voltage $V_{PA}$. In an embodiment, the input circuit 38 may include a time advance circuit 40, which can be a resistor-capacitor (RC) circuit, as an example. The time advance circuit 40 is configured to provide a time advance in the correction term $C_{TERM}$ before applying the correction term $C_{TERM}$ to the feedback signal 30. In a non-limiting example, the time advance can be so determined to compensate for a processing delay in the voltage amplifier 32.

In a non-limiting example, the control circuit 28 can generate the correction term $C_{TERM}$ as a function of the voltage differential $\Delta V$, as expressed in equation (Eq. 2) below.

$$C_{TERM}=-K*\Delta V \quad (Eq. 2)$$

In the equation (Eq. 2), K represents a gain factor, which can be expressed in equation (Eq. 3) below.

$$K=(1+Z_{ETIC}/Z_{TRACE})/(Z_2/Z_1) \quad (Eq. 3)$$

In the equation (Eq. 3), $Z_1$ represents an inherent impedance of the input circuit 38 and $Z_2$ represents an inherent impedance of the feedback circuit 36. As a function of the voltage differential $\Delta V$, the correction term $C_{TERM}$ is a voltage correction term. In this regard, the correction term $C_{TERM}$ can be applied directly to the feedback signal 30 that indicates the generated voltage $V_{CC}$.

Figure 4:
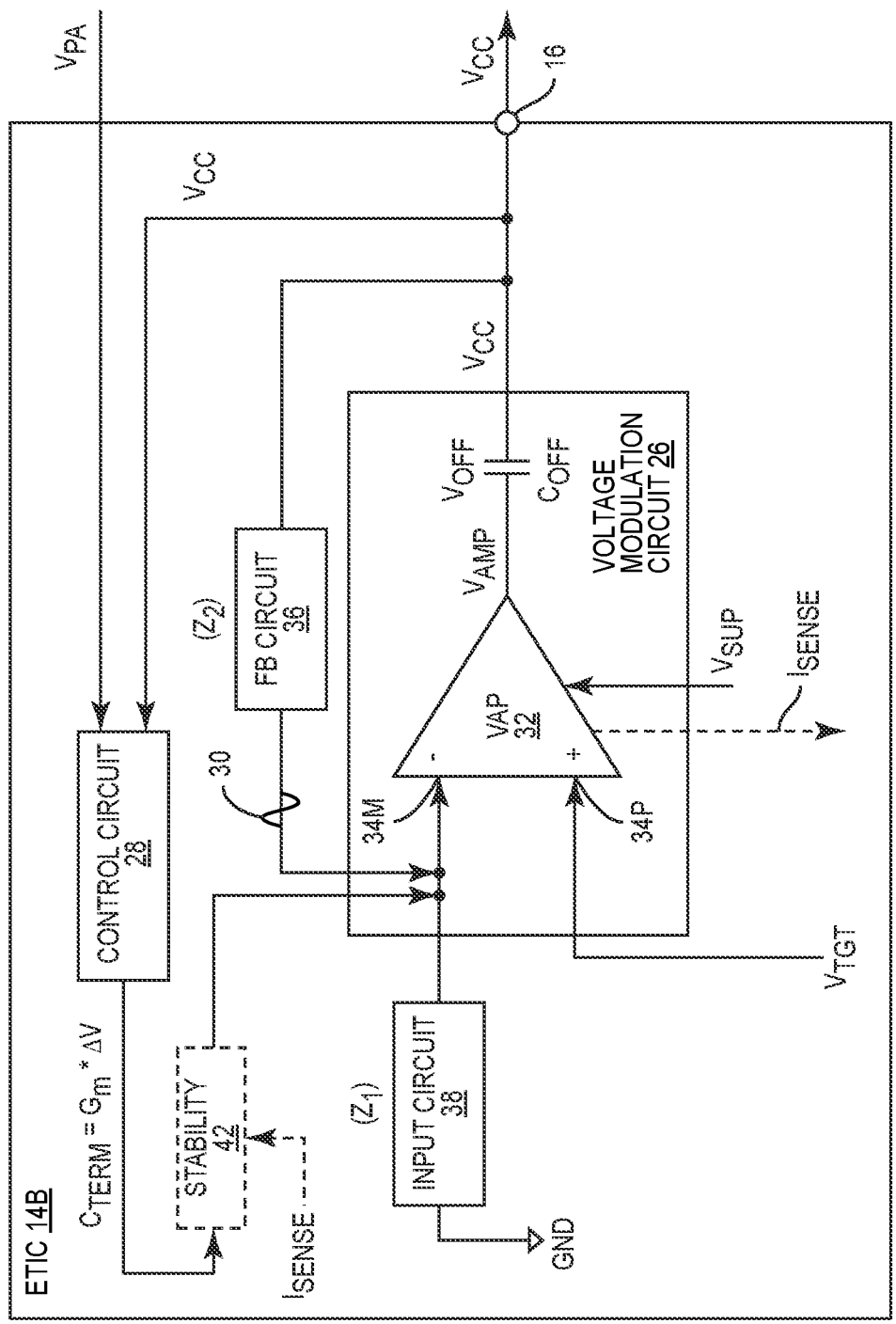

In an alternative embodiment, the control circuit 28 may also be configured to generate the correction term $C_{TERM}$ as a current correction term. In this regard, FIG. 4 is a schematic diagram of an exemplary ETIC 14B configured according to another embodiment of the present disclosure.

Herein, the feedback circuit 36 is also configured to generate the feedback signal 30 to indicate the generated modulated voltage $V_{CC}$. The input circuit 38, however, is coupled between the negative input 34M and a ground (GND). The control circuit 28, on the other hand, is coupled directly to the negative input 34M and configured to provide the correction term $C_{TERM}$ directly to the negative input 34M. Herein, the control circuit 28 is configured to generate the correction term $C_{TERM}$ as a current correction term, as expressed in equation (Eq. 4).

$$C_{TERM} = -G_m * \Delta V \tag{Eq. 4}$$

In the equation (Eq. 4), $G_m$ represents a transconductance that converts the voltage differential $\Delta V$ into the current correction term. The transconductance $G_m$ may be determined based on equation (Eq. 5) below.

$$G_m = (1 + Z_{ETIC}/Z_{TRACE})/Z_2 \tag{Eq. 5}$$

Notably, when the current correction term is provided to the negative input 34M, the inherent impedance $Z_1$ of the input circuit 38 can cause the current correction term to be converted back to a voltage correction term.

In an embodiment, the voltage amplifier 32 may generate a sensed current $I_{SENSE}$ to indicate the modulated current $I_{CC}$ being sourced or sunk by the voltage amplifier 32. The sensed current $I_{SENSE}$ may be used by a stability circuit 42 to help improve stability of the correction term $C_{TERM}$ across a modulation bandwidth of the RF signal 22.

Alternative to applying the correction term $C_{TERM}$ to the feedback signal 30, it is also possible to apply the correction term $C_{TERM}$ to the modulated voltage $V_{TGT}$, as described next in FIGS. 5 and 6.

Figure 5:
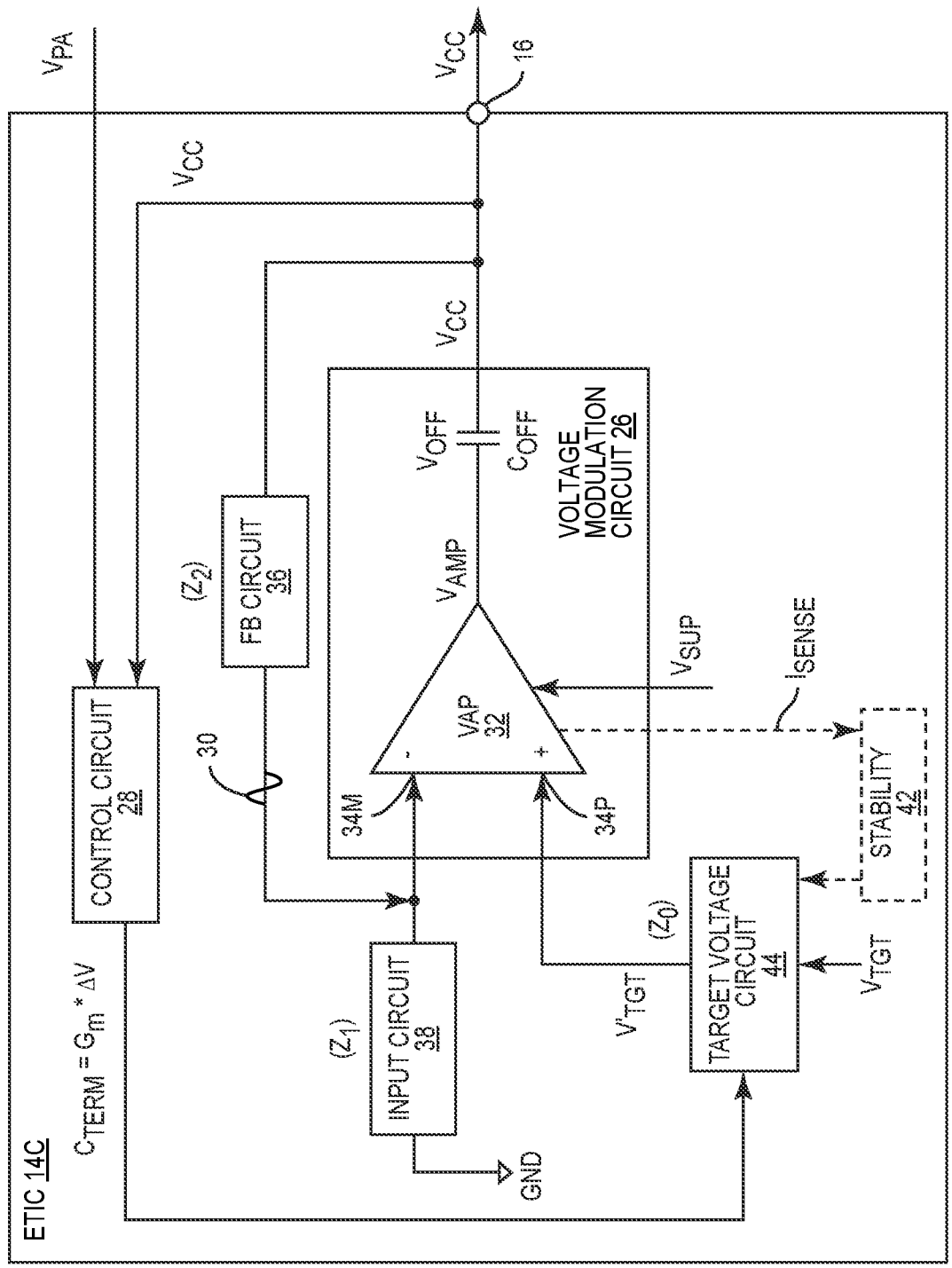
Figure 6:
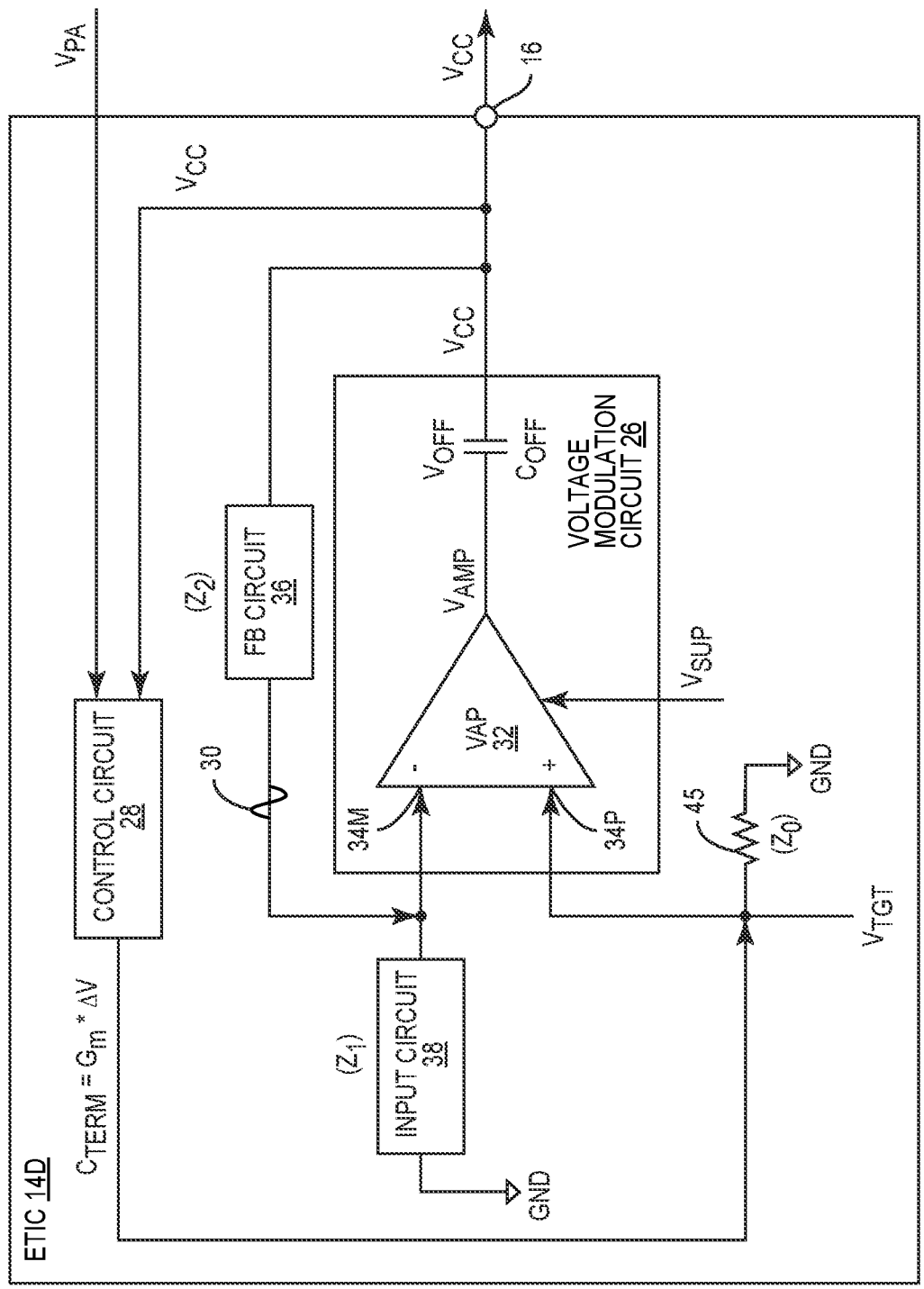

FIG. 5 is a schematic diagram of an exemplary ETIC 14C configured according to another embodiment of the present disclosure. The ETIC 14C includes a target voltage circuit 44. The target voltage circuit 44 is configured to receive the modulated target voltage $V_{TGT}$ and the correction term $C_{TERM}$ from the control circuit 28. Accordingly, the target voltage circuit 44 modifies the modulated target voltage $V_{TGT}$ based on the correction term $C_{TERM}$ to generate a modified target voltage $V'_{TGT}$ and provides the modified target voltage $V'_{TGT}$ to the positive input 34P to thereby cause the voltage modulation circuit 26 to modify the generated modulated voltage $V_{CC}$.

In a non-limiting example, the modified target voltage $V'_{TGT}$ can be expressed in equation (Eq. 6) below.

$$V'_{TGT} = V_{TGT} + V_{CORRECTION} \tag{Eq. 6}$$

In the equation (Eq. 6), $V_{CORRECTION}$ represents a target voltage correction term to be added to the modulated voltage $V_{TGT}$. Herein, the control circuit 28 is configured to generate the correction term $C_{TERM}$ as a current correction, as expressed in equation (Eq. 7) below.

$$C_{TERM} = G_m * \Delta V \tag{Eq. 7}$$

In the equation (Eq. 7), $G_m$ represents a transconductance that converts the voltage differential $\Delta V$ into the current correction term. In this regard, the target voltage circuit 44, which as an inherent impedance $Z_0$, needs to convert the correction term $C_{TERM}$ into the target voltage correction term $V_{CORRECTION}$ to be added to the modulated voltage $V_{TGT}$.

The target voltage circuit 44 may be replaced by a resistor circuit with the inherent impedance $Z_0$. In this regard, FIG. 6 is a schematic diagram of an exemplary ETIC 14D configured according to another embodiment of the present disclosure.

The ETIC 14D includes a resistor circuit 45 coupled between the positive input 34P and the GND. Notably, the resistor circuit 45 can effectively convert the correction term $C_{TERM}$, which was generated as the current correction term based on the equation (Eq. 7), into the target voltage correction term $V_{CORRECTION}$ to be added to the modulated voltage $V_{TGT}$.

Figure 7:
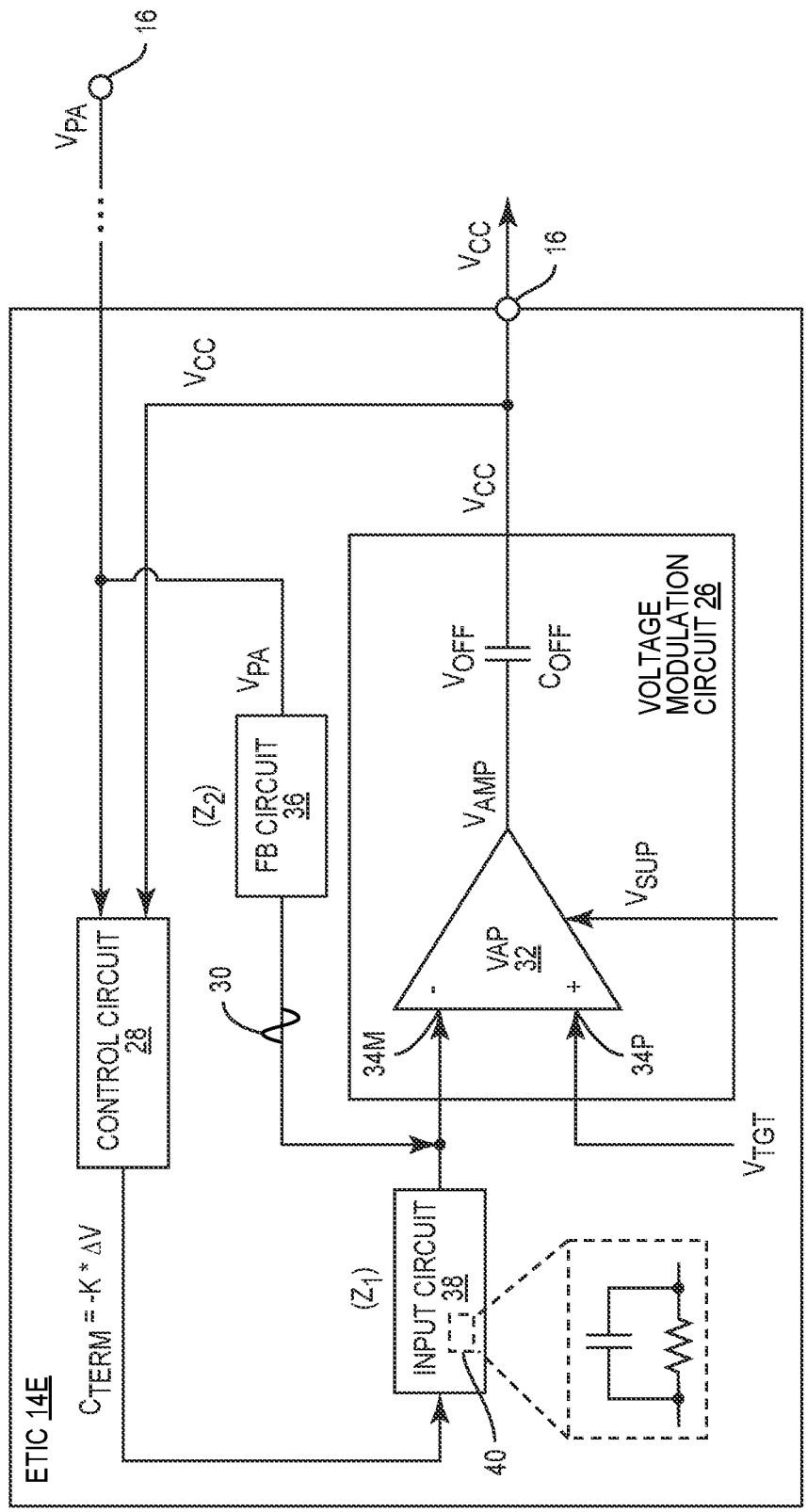

Alternative to generating the feedback signal 30 to indicate the generated modulated voltage $V_{CC}$, as described in FIGS. 3 to 6, it is also possible to generate the feedback signal 30 to indicate the received modulated voltage $V_{PA}$. In this regard, FIG. 7 is a schematic diagram of an exemplary ETIC 14E configured according to another embodiment of the present disclosure.

Herein, the feedback circuit 36 is configured to generate the feedback signal 30 to indicate the received modulated voltage $V_{PA}$ at the power amplifier input 18. In this regard, the control circuit 28 can determine the correction term $C_{TERM}$ in accordance with equation (Eq. 8) below.

$$C_{TERM} = -K * \Delta V \tag{Eq. 8}$$

In the equation (Eq. 8), K represents a gain factor, which can be expressed in equation (Eq. 9) below.

$$K = [(Z_{ETIC} + Z_{PA})/Z_{TRACE}] * (Z_1/Z_2) \tag{Eq. 9}$$

With reference back to FIG. 1, although it is undesirable to couple a large-capacitance decoupling capacitor to the power amplifier input 18, it is nevertheless possible to provide a much smaller decoupling capacitor $C_{PA}$ inside the power amplifier circuit 12 to help provide some level of impedance isolation. As such, the correction term $C_{TERM}$ may need to take into consideration the possible interaction between the decoupling capacitor $C_{PA}$ and the modulated current $I_{CC}$. As such, the control circuit 28 may be configured to add a compensation term to the correction term $C_{TERM}$ to compensate for impact caused by the decoupling capacitor $C_{PA}$.

Figure 8:
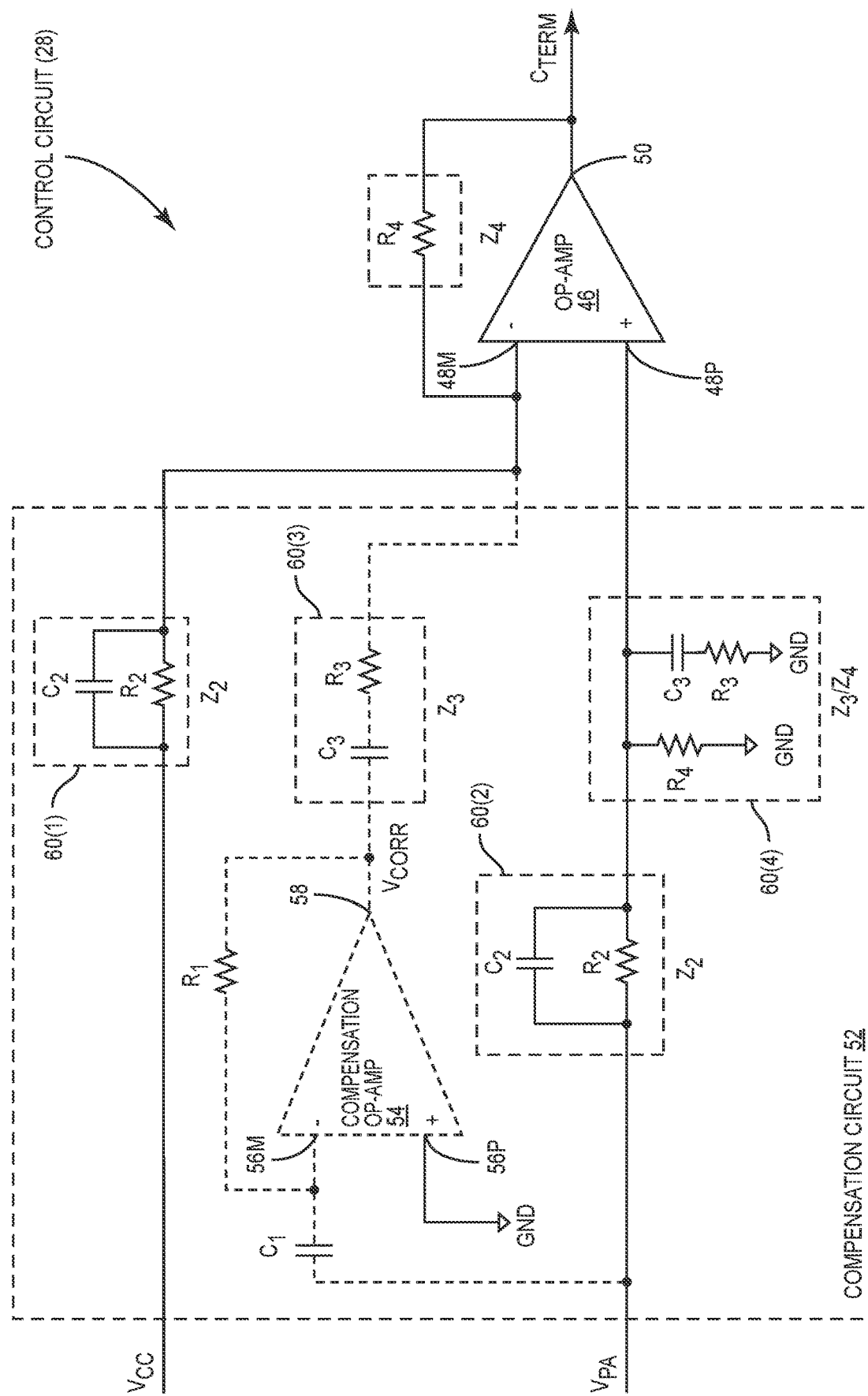
FIG. 8 is a schematic diagram providing an exemplary illustration of a control circuit in the ETIC of FIGS. 3-7.

In this regard, FIG. 8 is a schematic diagram providing an exemplary illustration of the control circuit 28 in FIGS. 2 to 7 according to an embodiment of the present disclosure. Common elements between FIGS. 2 to 8 are shown therein with common element numbers and will not be re-described herein.

The control circuit 28 includes an op-amp 46. The op-amp 46 includes a positive op-amp input 48P and a negative op-amp input 48M. The negative op-amp input 48M is coupled to the ETIC output 16 to receive the generated modulated voltage $V_{CC}$. The positive op-amp input 48P is coupled to the power amplifier input 18 to receive the received modulated voltage $V_{PA}$. The op-amp 46 is configured to generate the correction term $C_{TERM}$ as a function of the voltage differential $\Delta V$ and output the correction term $C_{TERM}$ via an op-amp output 50. Notably, the op-amp 46 is configured to generate the correction term $C_{TERM}$ as a voltage correction term. In this regard, the op-amp 46 may be further configured to include or be coupled to a transconductance stage (not shown) to convert the voltage correction term into a current correction term, as needed.

The control circuit 28 may further include a compensation circuit 52 coupled between the positive op-amp input 48P and the negative op-amp input 48M. In a non-limiting example, the compensation circuit 52 includes a compensation op-amp 54, which includes a positive compensation input 56P, a negative compensation input 56M, and a compensation output 58. The compensation circuit 52 also includes multiple resistor-capacitor (RC) circuits 60(1)-60(4).

The RC circuit 60(1) may be provided between the ETIC output 16 and the negative op-amp input 48M. The RC circuits 60(2) and 60(4) may be provided in series between the power amplifier input 18 and the positive op-amp input 48P. The RC circuit 60(3) may be provided between the compensation output 58 and the negative op-amp input 48M. The negative compensation input 56M is coupled to the positive op-amp input 48P via a capacitor $C_1$ and the RC circuits 60(2) and 60(3). The positive compensation input 56P may be coupled to the GND.

In an embodiment, the compensation circuit 52 is configured to generate a compensation term $V_{CORR}$ in the correction term $C_{TERM}$ to thereby offset a variation in the voltage differential $\Delta V$ resulting from the decoupling capacitor $C_{PA}$. Specifically, the correction term $C_{TERM}$ can be determined based on a second order transfer function as expressed in equation (Eq. 10) below.

$$C_{TERM} = -\Delta V^*(R_4/R_2)^*(1+R_2{}^*C_2{}^*s) + V_{PA}{}^* (R_1{}^*R_4{}^*C_1{}^*C_3{}^*s^2)/(1+R_3{}^*C_3{}^*s) \qquad (\text{Eq. 10})$$

Those skilled in the art will recognize improvements and modifications to the preferred embodiments of the present disclosure. All such improvements and modifications are considered within the scope of the concepts disclosed herein and the claims that follow.

What is claimed is:

1. A transmission circuit comprising:
   a power amplifier (PA) circuit configured to amplify a radio frequency (RF) signal based on a modulated voltage received at a PA input; and
   an envelope tracking (ET) integrated circuit (ETIC) comprising:
      an ETIC output coupled to the PA input via a conductive path;
      a voltage modulation circuit configured to generate the modulated voltage at the ETIC output based on a modulated target voltage and a feedback signal that indicates a selected one of the modulated voltage at the ETIC output and the modulated voltage at the PA input; and
      a control circuit configured to:
         generate a correction term based on the modulated voltage at the ETIC output and the modulated voltage at the PA input; and
         apply the correction term to a selected one of the modulated target voltage and the feedback signal to cause the voltage modulation circuit to modify the modulated voltage to thereby suppress a ripple in the modulated voltage at the PA input.

2. The transmission circuit of claim 1, wherein the voltage modulation circuit comprises:
   a voltage amplifier comprising a positive input configured to receive the modulated target voltage and a negative input configured to receive the feedback signal, the voltage amplifier is configured to generate an initial modulated voltage based on the modulated target voltage and the feedback signal; and
   an offset capacitor coupled between the voltage amplifier and the ETIC output, the offset capacitor is configured to raise the initial modulated voltage by an offset voltage to thereby generate the modulated voltage at the ETIC output.

3. The transmission circuit of claim 1, further comprising a feedback circuit coupled between the ETIC output and the voltage modulation circuit and configured to generate the feedback signal that indicates the modulated voltage at the ETIC output.

4. The transmission circuit of claim 3, wherein the control circuit is further configured to apply the correction term to the feedback signal to thereby cause the voltage modulation circuit to modify the modulated voltage.

5. The transmission circuit of claim 4, wherein the correction term is a voltage correction term expressed as: $-K^*\Delta V$, wherein:
   $\Delta V$ represents a voltage differential between the modulated voltage at the ETIC output and the modulated voltage at the PA input; and
   K represents a gain factor.

6. The transmission circuit of claim 4, further comprising an input circuit coupled between the control circuit and the voltage modulation circuit, the input circuit is configured to receive the correction term from the control circuit and apply the correction term to the feedback signal.

7. The transmission circuit of claim 6, wherein the input circuit is configured to provide a time advance in the correction term.

8. The transmission circuit of claim 4, wherein the correction term is a current correction term expressed as: $-G_m{}^*\Delta V$, wherein:
   $\Delta V$ represents a voltage differential between the modulated voltage at the ETIC output and the modulated voltage at the PA input; and
   $G_m$ represents a transconductance that converts the voltage differential into the current correction term.

9. The transmission circuit of claim 8, further comprising an input circuit coupled between the voltage modulation circuit and a ground, the input circuit is configured to convert the current correction term to a voltage correction term.

10. The transmission circuit of claim 3, wherein the control circuit is further configured to apply the correction term to the modulated target voltage to thereby cause the voltage modulation circuit to modify the modulated voltage.

11. The transmission circuit of claim 10, wherein the correction term is a current correction term expressed as: $G_m{}^*\Delta V$, wherein:
   $\Delta V$ represents a voltage differential between the modulated voltage at the ETIC output and the modulated voltage at the PA input; and
   $G_m$ represents a transconductance that converts the voltage differential into the current correction term.

12. The transmission circuit of claim 11, further comprising a target voltage circuit configured to:
   receive the modulated target voltage;
   receive the current correction term from the control circuit; and
   modify the modulated target voltage based on the current correction term to thereby cause the voltage modulation circuit to modify the modulated voltage.

13. The transmission circuit of claim 11, further comprising a resistor circuit configured to convert the current correction term into a voltage correction term.

14. The transmission circuit of claim 1, further comprising a feedback circuit coupled between the PA input and the voltage modulation circuit and configured to generate the feedback signal that indicates the modulated voltage at the PA input.

15. The transmission circuit of claim 14, wherein the control circuit is further configured to apply the correction term to the feedback signal to thereby cause the voltage modulation circuit to modify the modulated voltage.

16. The transmission circuit of claim 15, wherein the correction term is a voltage correction term expressed as: $-K*\Delta V$, wherein:
 $\Delta V$ represents a voltage differential between the modulated voltage at the ETIC output and the modulated voltage at the PA input; and
 K represents a gain factor.

17. The transmission circuit of claim 15, further comprising an input circuit coupled between the control circuit and the voltage modulation circuit, the input circuit is configured to receive the correction term from the control circuit and apply the correction term to the feedback signal.

18. The transmission circuit of claim 17, wherein the input circuit is configured to provide a time advance in the correction term.

19. The transmission circuit of claim 1, wherein the control circuit comprises an operational amplifier (op-amp) having a negative op-amp input coupled the ETIC output and a positive op-amp input coupled to the PA input, the op-amp is configured to generate the correction term based on a voltage differential between the modulated voltage at the ETIC output and the modulated voltage at the PA input.

20. The transmission circuit of claim 19, wherein the control circuit further comprises a compensation circuit coupled between the negative op-amp input and the positive op-amp input, the compensation circuit is configured to generate a compensation term in the correction term to thereby offset a variation in the voltage differential resulting from a decoupling capacitor coupled to the PA input and a ground.

* * * * *